(12) United States Patent
Nguyen et al.

(10) Patent No.: US 7,551,043 B2
(45) Date of Patent: Jun. 23, 2009

(54) MICROMECHANICAL STRUCTURES HAVING A CAPACITIVE TRANSDUCER GAP FILLED WITH A DIELECTRIC AND METHOD OF MAKING SAME

(75) Inventors: Clark T.-C. Nguyen, Ann Arbor, MI (US); Yu-Wei Lin, Ann Arbor, MI (US); Sheng-Shian Li, Ann Arbor, MI (US); Yuan Xie, Sunnyvale, CA (US)

(73) Assignee: The Regents of the University of Michigan, Ann Arbor, MI (US)

( * ) Notice: Subject to any disclaimer, the term of this patent is extended or adjusted under 35 U.S.C. 154(b) by 224 days.

(21) Appl. No.: 11/511,202

(22) Filed: Aug. 28, 2006

(65) Prior Publication Data
US 2007/0046398 A1 Mar. 1, 2007

Related U.S. Application Data

(60) Provisional application No. 60/712,298, filed on Aug. 29, 2005.

(51) Int. Cl.
*H03H 9/125* (2006.01)
*H03H 9/24* (2006.01)
*H03H 3/007* (2006.01)
*H03H 9/52* (2006.01)

(52) U.S. Cl. ...................... 333/186; 333/200
(58) Field of Classification Search ................ 333/186, 333/197, 199, 200
See application file for complete search history.

(56) References Cited

U.S. PATENT DOCUMENTS

| | | | |
|---|---|---|---|
| 6,429,755 B2 * | 8/2002 | Speidell et al. ............ 333/197 |
| 6,628,177 B2 | 9/2003 | Clark et al. | |
| 6,846,691 B2 | 1/2005 | Hsu et al. | |
| 6,856,217 B1 | 2/2005 | Clark et al. | |
| 6,909,221 B2 * | 6/2005 | Ayazi et al. ............... 310/321 |
| 6,985,051 B2 | 1/2006 | Nguyen et al. | |
| 7,023,065 B2 * | 4/2006 | Ayazi et al. ............... 257/414 |
| 2006/0017523 A1 | 1/2006 | Bhave et al. | |
| 2007/0103258 A1 * | 5/2007 | Weinstein et al. ............ 33/186 |

OTHER PUBLICATIONS

U.S. Appl. No. 60/577,261, Bhave, et al. filed Jun. 4, 2004.

(Continued)

*Primary Examiner*—Barbara Summons
(74) *Attorney, Agent, or Firm*—Brooks Kushman P.C.

(57) ABSTRACT

Micromechanical structures having at least one lateral capacitive transducer gap filled with a dielectric and method of making same are provided. VHF and UHF MEMS-based vibrating micromechanical resonators filled with new solid dielectric capacitive transducer gaps to replace previously used air gaps have been demonstrated at 160 MHz, with Q's~20,200 on par with those of air-gap resonators, and motional resistances ($R_x$'s) more than 8× smaller at similar frequencies and bias conditions. This degree of motional resistance reduction comes about via not only the higher dielectric constant provided by a solid-filled electrode-to-resonator gap, but also by the ability to achieve smaller solid gaps than air gaps. These advantages with the right dielectric material may now allow capacitively-transduced resonators to match to the 50-377Ω impedances expected by off-chip components (e.g., antennas) in many wireless applications without the need for high voltages.

19 Claims, 6 Drawing Sheets

OTHER PUBLICATIONS

Wang, J., et al. 1.51-GHz Nanocrystalline Diamond Micromechanical Disk Resonator with Material-Mismatched Isolating Support, Technical Digest, IEEE Int. Micro Electro Mechanical Systems, Conf., Maastricht, The Netherlands, Jan. 2004, pp. 641-644.

Li, S.-S., et al., Micromechanical Hollow-Disk Ring Resonators, Technical Digest, IEEE Int. Micro Electro Mechanical Systems Conf., Maastricht, The Netherlands, Jan. 2004, pp. 821-824.

Wang, J., 1.156-GHz Self-Aligned Vibrating Micromechanical Disk Resonator, IEEE Transactions on Ultrasonics, Ferroelectrics, and Frequency Control, vol. 51, No. 12, Dec. 2004, pp. 1607-1628.

Nguyen, C.T.-C., et al., Vibrating RF MEMS for Next Generation Wireless Applications, Proceedings, IEEE Custom Integrated Circuits Conf., Orlando, Florida, Oct. 2004, pp. 257-264.

Kaajakari, V., et al. Stability of Wafer Level Vacuum Encapsulated Single-Crystal Silicon Resonators, Digest of Technical Papers, Int. Conf. on Solid-State Sensors, Actuators, and Microsystems (Transducers '05), Seoul, Korea, Jun. 2005, pp. 916-919.

Kim, B., et al., Frequency Stability of Wafer-Scale Encapsulated MEMS Resonators, Digest of Technical Papers, Int. Conf. on Solid-State Sensors, Actuators and Microsystems (Transducers '05), Seoul, Korea, Jun. 2005, pp. 1965-1968.

Hsu, W.-T., et al., Stiffness-Compensated Temperature-Insensitive Micromechanical Resonators, Technical Digest, IEEE Int. Microelectro Mechanical Systems Conf., Las Vegas, Nevada, Jan. 2002, pp. 731-734.

Lin, Y.-W., et al., Series-Resonant VHF Micromechanical Resonator Reference Oscillators, IEEE Journhal of Solid-State Circuits, vol. 39, No. 12, pp. 2477-2491, Dec. 2004.

Piazza, G., et al., Low Motional Resistance Ring-Shaped Contour-Mode Aluminum Nitride Piezoelectric Micromechanical Resonators for UHF Applications, Technical Digest, IEEE Int. Micro Electro Mechanical Systems Conf., Miami Beach, Florida, Jan. 2005, pp. 20-23.

Li, S.-S., et al., Self-Switching Vibrating Micromechanical Filter Bank, Proceedings, IEEE Joint Int. Frequency Control/Precision Time & Time Interval Symposium, Vancouver, Canada, Aug. 2005.

Wong, A.-C., et al., Micromechanical Mixer-Filters ("Mixlers"), Journal of Microelectromechanical Systems, vol. 13, No. 1, Feb. 2004, pp. 100-112.

Bircumshaw, B., et al., The Radial Bulk Annular Resonator: Towards a 50 Omega RF MEMS Filter, Digest of Technical Papers, Int. Conf. on Solid-State Sensors, Actuators and Microsystems (Transducers '03), Boston, MA, Jun. 2003, pp. 875-878.

Xie, Y., et al., UHF Micromechanical Extensional Wine-Glass Mode Ring Resonators, Technical Digest, IEEE International Electron Devices Meeting, Washington, D.C., WA, Dec. 2003, pp. 953-956.

Demirci, M.U., et al., Mechanically Corner-Coupled Square Microresonator Array for Reduced Series Motional Resistance, Digest of Technical Papers, Int. Conf. on Solid-State Sensors, Actuators and Microsystems (Transducers '03) Boston, MA, Jun. 2003, pp. 955-958.

Bhave, S.A., et al., Silicon Nitride-on-Silicon Bar Resonator Using Internal Electrostatic Transduction, Digest of Technical Papers, Int. Conf. on Solid-State Sensors, Actuators and Microsystems (Transducers '05), Seoul, Korea, Jun. 2005, pp. 2139-2142.

Onoe, M., Contour Vibrations of Isotropic Circular Plates, J. Acoustical Society of America, vol. 28, No. 6, Nov. 1956, pp. 1158-1162.

* cited by examiner

MICROMECHANICAL STRUCTURES HAVING A CAPACITIVE TRANSDUCER GAP FILLED WITH A DIELECTRIC AND METHOD OF MAKING SAME

CROSS-REFERENCE TO RELATED APPLICATION

This application claims the benefit of U.S. provisional application Ser. No. 60/712,298, filed Aug. 29, 2005.

STATEMENT REGARDING FEDERALLY SPONSORED RESEARCH OR DEVELOPMENT

The invention was made with Government support under Contract No. F30602-01-1-0573 from USAF/AFRL. The Government has certain rights to the invention.

BACKGROUND OF THE INVENTION

1. Field of the Invention

This invention relates to micromechanical structures having a capacitive transducer gap filled with a dielectric and method of making same.

2. Background Art

The following non-patent references are referenced herein:

[1] J. Wang et al., "1.51-GHz Nanocrystalline Diamond Micromechanical Disk Resonator With Material-Mismatched Isolating Support" TECHNICAL DIGEST, IEEE INT. MICRO ELECTRO MECHANICAL SYSTEMS, CONF., Maastricht, The Netherlands, Jan. 2004, pp. 641-644.

[2] S.-S. Li et al., "Micromechanical 'Hollow-Disk' Ring Resonators," TECHNICAL DIGEST, IEEE INT. MICRO ELECTRO MECHANICAL SYSTEMS CONF., Maastricht, The Netherlands, January 2004, pp. 821-824.

[3] J. Wang et al., "1.156-GHz Self-Aligned Vibrating Micromechanical Disk Resonator," IEEE TRANSACTIONS ON ULTRASONICS, FERROELECTRICS, AND FREQUENCY CONTROL, Vol. 51, No. 12, pp. 1607-1628, December 2004.

[4] C. T.-C. Nguyen, "Vibrating RF MEMS for Next Generation Wireless Applications," PROCEEDINGS, IEEE CUSTOM INTEGRATED CIRCUITS CONF., Orlando, Fla., October 2004, pp. 257-264.

[5] V. Kaajakari et al., "Stability of Wafer Level Vacuum Encapsulated Single-Crystal Silicon Resonators," DIGEST OF TECHNICAL PAPERS, INT. CONF. ON SOLID-STATE SENSORS, ACTUATORS, AND MICROSYSTEMS (TRANSDUCERS '05), Seoul, Korea, June 2005, pp. 916-919.

[6] B. Kim et al., "Frequency Stability of Wafer-Scale Encapsulated MEMS Resonators," DIGEST OF TECHNICAL PAPERS, INT. CONF. ON SOLID-STATE SENSORS, ACTUATORS AND MICROSYSTEMS (TRANSDUCERS '05), Seoul, Korea, June 2005, pp. 1965-1968.

[7] W.-T. Hsu et al., "Stiffness-Compensated Temperature-Insensitive Micromechanical Resonators," TECHNICAL DIGEST, IEEE INT. MICROELECTRO MECHANICAL SYSTEMS CONF., Las Vegas, Nev., January 2002, pp. 731-734.

[8] Y.-W. Lin et al., "Series-Resonant VHF Micromechanical Resonator Reference Oscillators," IEEE JOURNAL OF SOLID-STATE CIRCUITS, Vol. 39, No. 12, pp. 2477-2491, December 2004.

[9] G. Piazza et al., "Low Motional Resistance Ring-Shaped Contour-Mode Aluminum Nitride Piezoelectric Micromechanical Resonators for UHF Applications," TECHNICAL DIGEST, IEEE INT. MICRO ELECTRO MECHANICAL SYSTEMS CONF., Miami Beach, Fla., January 2005, pp. 20-23.

[10] S.-S. Li et al., "Self-Switching Vibrating Micromechanical Filter Bank," PROCEEDINGS, IEEE JOINT INT. FREQUENCY CONTROL/PRECISION TIME & TIME INTERVAL SYMPOSIUM, Vancouver, Canada, August 2005.

[11] A.-C. Wong et al., "Micromechanical Mixer-Filters ("Mixlers")," JOURNAL OF MICROELECTROMECHANICAL SYSTEMS, Vol. 13, No. 1, pp. 100-112, February 2004.

[12] B. Bircumshaw et al., "The Radial Bulk Annular Resonator:

Towards a 500Ω RF MEMS Filter," DIGEST OF TECHNICAL PAPERS, INT. CONF. ON SOLID-STATE SENSORS, ACTUATORS AND MICROSYSTEMS (TRANSDUCERS '03), Boston, Mass., June 2003, pp. 875-878.

[13] Y. Xie et al., "UHF Micromechanical Extensional Wine-Glass Mode Ring Resonators," TECHNICAL DIGEST, IEEE INTERNATIONAL ELECTRON DEVICES MEETING, Washington D.C., WA, December 2003, pp. 953-956.

[14] M. U. Demirci et al., "Mechanically Corner-Coupled Square Microresonator Array for Reduced Series Motional Resistance," DIGEST OF TECHNICAL PAPERS, INT. CONF. ON SOLID-STATE SENSORS, ACTUATORS AND MICROSYSTEMS (TRANSDUCERS '03) Boston, Mass., June 2003, pp. 955-958.

[15] S. A. Bhave et al., "Silicon Nitride-on-Silicon Bar Resonator Using Internal Electrostatic Transduction," DIGEST OF TECHNICAL PAPERS, INT. CONF. ON SOLID-STATE SENSORS, ACTUATORS AND MICROSYSTEMS (TRANSDUCERS '05), Seoul, Korea, June 2005, pp. 2139-2142.

[16] M. Onoe, "Contour Vibrations of Isotropic Circular Plates," J. ACOUSTICAL SOCIETY OF AMERICA, Vol. 28, No. 6, pp. 1158-1162, November 1956.

Capacitively transduced vibrating micromechanical resonators have recently been demonstrated with resonant frequencies in the GHz range with Q's larger than 11,000 [1] [2] [3], making them very attractive as on-chip frequency control elements for oscillators and filters in wireless communications. Although solutions now exist to many of the issues that once hindered deployment of these devices in RF front ends [4], including aging [5] [6] and temperature stability [7], the need for high bias voltages to reduce impedances, especially in the VHF and UHF ranges, still remains a troublesome drawback of this technology. For example, in reference oscillator applications, where the impedance of the micromechanical resonator must be low enough to allow oscillation startup, dc-bias voltages on the order of 12 V, much larger than normally permitted in standard integrated circuit (IC) technologies, have been required to attain GSM-compliant phase noise specifications [8]. For off-chip filter applications, impedance needs in the 50-377Ω range (e.g., for antenna matching) are even more challenging, so require even high voltages. Needless to say, a method for attaining low impedance with IC-amenable voltages would be highly desirable.

For this matter, micromechanical resonators using piezoelectric transducers already achieve low impedance, and without the need for bias voltages. Although many such piezoelectric designs suffer the drawback of having frequencies governed primarily by thickness, hence, not CAD definable; new piezoelectric micromechanical resonators that harness the $d_{31}$ coefficient to allow lateral operation now circumvent this problem [9], making piezoelectric transduction much more attractive. Still, the (so far) higher Q's of capacitively transduced resonators, their allowance for more flexible geometries with CAD-definable frequencies, plus their self-switching capability [10], voltage-controlled reconfigurability [11], better thermal stability [7], and material compatibility with integrated transistor circuits, make them sufficiently more attractive to justify intense research into methods for lowering their impedance while keeping voltages low. Among these, assuming that electrode-to-resonator gap spacings have already been minimized, methods that increase electrode-to-resonator overlap area by either direct geometrical modification [2] [12] [13] or mechanically-coupled arraying [14] have been most successful, albeit at the expense of die area.

The following U.S. patent references are related to the present invention: U.S. Pat. Nos. 6,846,691; 6,985,051; 6,856,217; 2006/0017523; and U.S. Pat. No. 6,628,177.

SUMMARY OF THE INVENTION

An object of the present invention is to provide micromechanical structures having at least one capacitive transducer gap filled with a dielectric and method of making same wherein impedance is lowered while avoiding the need to increase the area of a capacitively transduced micromechanical resonator by raising the permittivity of the dielectric in its capacitive gap, thereby raising the efficiency of its transducer.

In carrying out the above object and other objects of the present invention, a micromechanical device is provided. The device includes a micromechanical electrode and a micromechanical resonator fabricated on a substrate and having a motional resistance. The resonator and the electrode define a capacitive transducer gap. A dielectric having a permittivity value that is higher than the permittivity value of air is disposed in the gap to decrease the motional resistance of the resonator.

The dielectric may be selected from a group comprising titanium dioxide, hafnium dioxide, silicon nitride, and BST.

The resonator may be operable in a wine-glass mode.

Further in carrying out the above object and other objects of the present invention, a method of forming an electrostatic transducer is provided. The method includes the steps of forming a micromechanical electrode structure and forming a micromechanical resonator structure on a substrate. The electrode structure is separated from the resonator structure by a capacitive transducer gap. The method further includes filling the gap with a dielectric having a permittivity value that is higher than the permittivity value of air.

The dielectric may be selected from a group comprising titanium dioxide, hafnium dioxide, silicon nitride, and BST.

The thickness or length of dielectric across the gap may correspond to a quarter-wavelength of the resonance frequency of the composite resonator-electrode structure.

The resonator structure may be operable in a wine-glass mode.

The above object and other objects, features, and advantages of the present invention are readily apparent from the following detailed description of the best mode for carrying out the invention when taken in connection with the accompanying drawings.

BRIEF DESCRIPTION OF THE DRAWINGS

FIG. 2b is an electrical equivalent circuit for the wine-glass disk resonator of FIG. 2a;

FIGS. 5a, 5b, and 5c are SEMs of a fabricated 60 MHz wine-glass disk resonator with a solid nitride gap; FIGS. 5b and 5c are enlarged to show 20 nm solid gaps;

FIG. 6b showing a 20 nm nitride gap tested in vacuum; and FIG. 6c showing a 20 nm nitride gap tested in atmosphere;

FIG. 7a shows measured and predicted motional resistance and FIG. 7b shows edge-to-edge nitride gap displacement versus dc-bias voltage, respectively, for a 60 MHz wine-glass disk resonator with a 20 nm nitride gap;

FIG. 8a is for a 80 nm air gap tested in vacuum; and FIG. 8b is for a 20 nm nitride gap tested in vacuum.

DETAILED DESCRIPTION OF THE PREFERRED EMBODIMENTS

In one embodiment of the present invention, as described herein, VHF and UHF MEMS-based vibrating micromechanical wine-glass mode disks [8] equipped with new solid dielectric-filled capacitive transducer gaps to replace previously used air gaps have been demonstrated at 160 MHz, with Q's~20,200 on par with those of air-gap resonators, and motional resistances ($R_x$'s) more than 8× smaller at similar frequencies and bias conditions. (However, it is to be understood that the gaps may be filled with a dielectric fluid such as a dielectric liquid or gas without departing from the present invention.) This degree of motional resistance reduction comes about via not only the higher dielectric constant provided by a solid-filled electrode-to-resonator gap, but also by the ability to achieve smaller solid gaps than air gaps. These advantages with the right dielectric material may now allow capacitively-transduced resonators to match to the 50-377Ω impedances expected by off-chip components (e.g., antennas) in many wireless applications without the need for high voltages. In addition, as described herein, the use of filled-dielectric transducer gaps actually enhances the yield and reliability of capacitively transduced devices, since it removes problems generated by air gaps.

Air- vs. Solid-Gap Wine-Glass Disk Resonators

Again, this work uses disk resonator geometries operating in the compound (2,1)-mode (i.e., the "wine-glass disk" mode) to compare the performance of solid-gap versus air-gap capacitive transducers. Accordingly, some discussion of disk resonator fundamentals is in order, starting with that of previous air-gap versions.

Air Gap Wine-Glass Disk Resonator

Figure 1:
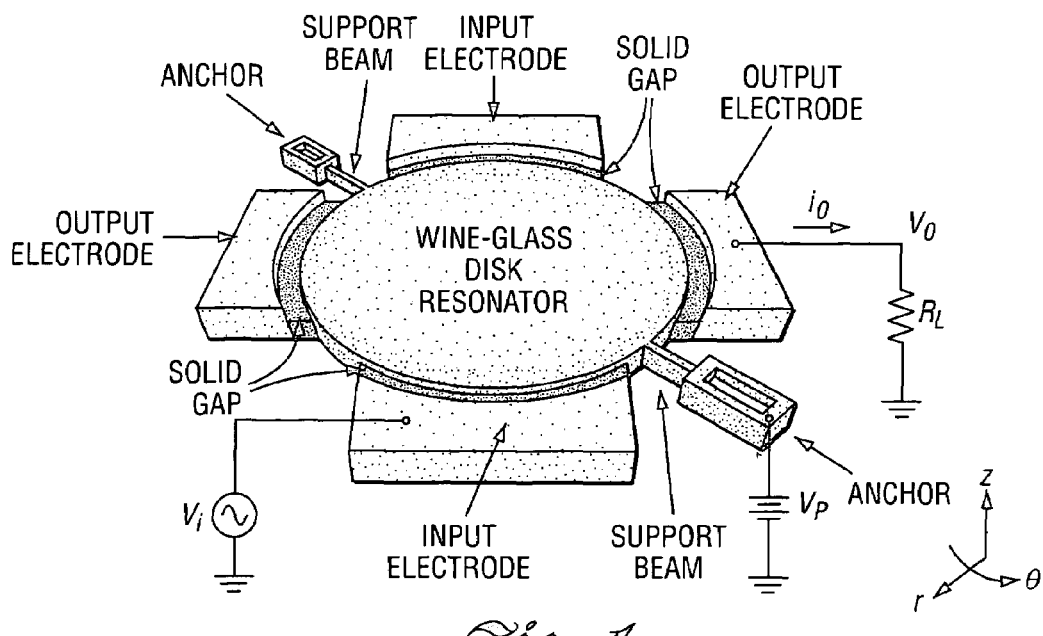
FIG. 1 is a perspective schematic view of a solid-gap micromechanical wine-glass disk resonator in two-port bias, drive, and sense configuration constructed in accordance with one embodiment of the present invention.
Figure 2A:
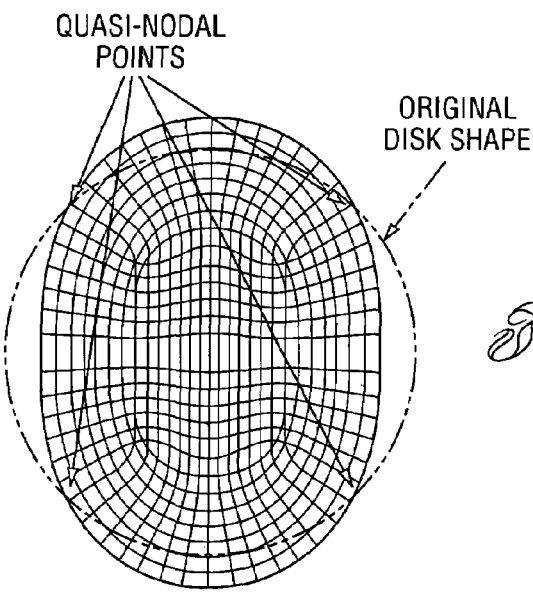
FIG. 2a is ANSYS mode-shape simulation of a wine-glass disk resonator.

FIG. 1 shows a solid-gap capacitive transducer constructed in accordance with one embodiment of the present invention and the electrical hookup required for two-port operation (in this case, using a solid-gap disk to be described later). As shown, the 60-MHz "wine-glass" device used here comprises a 32 μm-radius, 3 μm-thick disk supported by two beams that attach to the disk at its quasi-nodal points [8], where radial displacements are negligible compared to other parts of the disk structure when the disk vibrates in its wine-glass mode shape, shown in FIG. 2(a). In this mode shape, the disk expands along one axis and contracts in the orthogonal axis. Electrodes surround the disk with lateral electrode-to-disk air-gap spacings on the order of only 80 nm. To operate this device, a dc-bias $V_P$ is applied to the disk structure, and an ac voltage $v_i$ is applied to the input electrodes. (Note that there is no current flowing once the conductive structure is charged to $V_P$, so there is no dc power consumption). This $V_P v_i$ voltage combination generates a time-varying force proportional to the product $V_P v_i$ that drives the disk into the wine-glass mode shape when the frequency of $v_i$ matches the wine-glass resonance frequency $f_o$, obtainable by solution of [16]

$$\left[\Psi_n\left(\frac{\zeta}{\xi}\right) - n - q\right] \cdot [\Psi_n(\zeta) - n - q] = (nq - n)^2 \quad (1)$$

where $$\Psi_n(x) = \frac{x J_{n-1}(x)}{J_n(x)}, \quad \zeta = 2\pi f_0 R \sqrt{\frac{\rho(2 + 2\sigma)}{E}} \quad (2)$$

$$= \sqrt{\frac{2}{1 - \sigma}}, \quad q = \frac{\zeta^2}{2n^2 - 2}, \quad n = 2$$

and where $J_n(x)$ is a Bessel function of the first kind of order n; the $\Psi_n(x)$ are modified quotients of $J_n(x)$; R is the disk radius; and ρ, σ, and E are the density, Poisson ratio, and Young's modulus, respectively, of the disk structural material. Although hidden in the precision of (1)'s formulation, the resonance frequency $f_0$ of this wine-glass disk is to first order inversely proportional to its radius R.

Once vibrating, the dc-biased (by $V_P$) time-varying output electrode-to-resonator capacitors generate output currents $i_0$ equal to $$i_0 = V_P \cdot \frac{\partial C}{\partial r} \cdot \frac{\partial r}{\partial t} \cong V_P \cdot \left(\frac{\varepsilon_r \varepsilon_o A_o}{d_o^2}\right) \cdot (\omega_o X) \quad (3)$$

where $A_o$ and $d_o$ are the electrode-to-resonator overlap area and static gap spacing, respectively; $\varepsilon_o$ is the permittivity in vacuum; $\varepsilon_r$ is the permittivity in the gap (in this case, of air, $\varepsilon_r$=1); ∂C/∂r is the change in resonator-to-electrode capacitance per unit radial displacement; X is the amplitude of disk vibration; and $\omega_o$=2π$f_o$ is the radian resonance frequency. Here, ∂C/∂r is approximated for simplicity, but a more complete formulation can be found in [8].

Series Motional Resistance, $R_x$

Figure 2B:
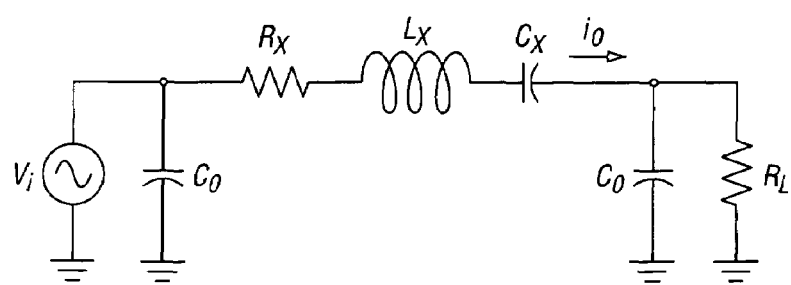

FIG. 2(b) presents the electrical equivalent circuit of the wine-glass disk resonator operated as a two-port (c.f., FIG. 1), where $R_x$, $L_x$, and $C_x$ are its motional resistance, inductance, and capacitance, respectively; and $C_o$ is the static electrode-to-disk capacitance. At resonance, $L_x$ and $C_x$ cancel, at which point the series motional resistance $R_x$ of the resonator governs the relationship between $v_i$ and $i_o$ (i.e., governs the impedance), and is determined approximately by the expression $$R_{x(Air Gap)} = \frac{v_i}{i_o} \cong \frac{k_r}{\omega_o V_P^2} \cdot \frac{d_o^4}{\varepsilon_r^2 \varepsilon_o^2 A_o^2} \cdot \frac{1}{Q_{(Air Gap)}} \quad (4)$$

where $k_r$ is the effective stiffness of the resonator [8], and $\varepsilon_r$=1 for air gap resonators.

From (4), $R_x$ can be lowered by (a) raising the dc-bias voltage $V_P$; (b) scaling down the electrode-to-resonator gap $d_o$; (c) increasing the electrode-to-resonator overlap area $A_o$; and (d) increasing the permittivity $\varepsilon_r$ of the electrode-to-resonator gap material. Of these approaches, lowering the gap spacing is by far the most effective, with a fourth power dependence. For air-gap resonators, however, the degree to which gap spacing can be lowered is limited by fabrication and linearity considerations, where too small a gap can compromise linearity and degrade the pull-in voltage to an unacceptably small value. The next most effective $R_x$-lowering parameters are the dc-bias voltage $V_P$, electrode-to-resonator overlap area $A_o$, and permittivity $\varepsilon_r$, all of which, when increased, reduce $R_x$ by square law functions. The degree to which dc-bias voltage can be increased for an air-gap resonator is limited by either the pull-in voltage or by the maximum system supply voltage. The degree to which area can be increased is limited by the maximum acceptable die footprint for the resonator, which in turn is governed by cost. Before this work, permittivity was normally relegated to that of air or vacuum for lateral resonators, like the disk of this work. The next section now addresses the degree to which permittivity can be increased.

Solid Nitride Gap Wine-Glass Disk Resonator

FIG. 1 presents a perspective-view schematic of the solid-gap micromechanical wine-glass disk resonator constructed in accordance with one embodiment of the present invention. As shown, this device is identical to its air-gap counterpart except for its electrode-to-resonator gaps, which are now filled with a solid dielectric material (in this case, silicon nitride, with $\varepsilon_r$=7.8). The presence of a dielectric in the gap actually provides a two-fold advantage in capacitive transducer efficiency (a) from the higher dielectric constant; and (b) by virtue of the fact that a smaller gap can now be achieved. The latter of these comes about because the gap no longer needs to be etched out, so is no longer limited by the ability of etchants to diffuse into the gap—something that has proved problematic in the past. In addition, the electrode and resonator can no longer be pulled into one another, so the catastrophic pull-in voltage is no longer an issue.

The above advantages, however, are somewhat dampened by the impedance of the solid dielectric material now in direct contact with the disk, replacing the low impedance air or vacuum present before. This solid material now imposes its own impedance into the system and can greatly reduce the overall displacement of the capacitive transducer electrodes, thereby reducing the output motional current. The expression for the output motional current of a solid-gap wine-glass mode disk resonator, of course, depends mainly on the compression and expansion of the solid-gap material, and is given by $$i_0 = V_P \cdot \frac{\partial C}{\partial r} \cdot \frac{\partial r}{\partial t} \cong V_P \cdot \left( \frac{\varepsilon_r \varepsilon_o A_o}{d_o^2} \right) \cdot (\omega_o X_n) \quad (5)$$

where $X_N$ is the edge-to-edge displacement of the solid-gap material, and $\epsilon_r$=7.8 for the case of the silicon nitride gap material used in this work.

The motional resistance of a solid-gap resonator can then be approximately expressed as $$R_{x(Solid\,Gap)} = \frac{v_i}{i_o} \cong \frac{k_r}{\omega_o V_P^2} \cdot \frac{d_o^4}{\varepsilon_r^2 \varepsilon_o^2 A_o^2} \cdot \frac{1}{Q_{(Solid\,Gap)}} \cdot \frac{1}{\gamma} \quad (6)$$

where $\gamma$ is a modified quotient of stiffness between the solid gap and surrounding electrode plates that at present is empirically extracted from measurement results. Dividing (6) by (4), the factor $\beta$ by which use of a solid dielectric capacitive gap reduces the series motional resistance $R_x$ can be expressed as $$\beta = \frac{R_{x(Air\,Gap)}}{R_{x(Solid\,Gap)}} = \varepsilon_{r(Solid\,Gap)}^2 \cdot \gamma \cdot \frac{Q_{(Solid\,Gap)}}{Q_{(Air\,Gap)}} \cdot \frac{d_{o(Air\,Gap)}^4}{d_{o(Solid\,Gap)}^4} \quad (7)$$

From (7), the factor by which $R_x$ is reduced can be maximized by increasing the dielectric constant of the solid gap material, by reducing the electrode-to-resonator gap spacing (which, as already mentioned, is enabled by use of a solid gap), and by impedance matching the solid gap material to the resonator-electrode system so as to maximize the edge-to-edge displacement of the solid gap material $X_N$. The dielectric may be of a quarter-wavelength design to maximize displacement. Essentially, dimensioning the thickness (or electrode-to-resonator spacing of the dielectric) to correspond to a quarter-wavelength of the frequency of resonance will maximize the displacement. In other words, the dielectric material may have a thickness approximately equal to a quarter acoustic wavelength.

Additional Solid Gap Advantages

Figure 3A:
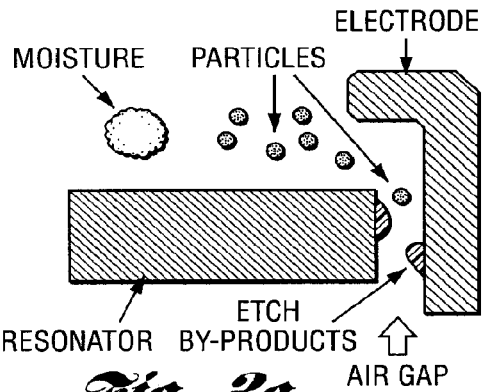
FIG. 3a is a side sectional schematic view of an air gap between a resonator and an electrode.
Figure 3B:
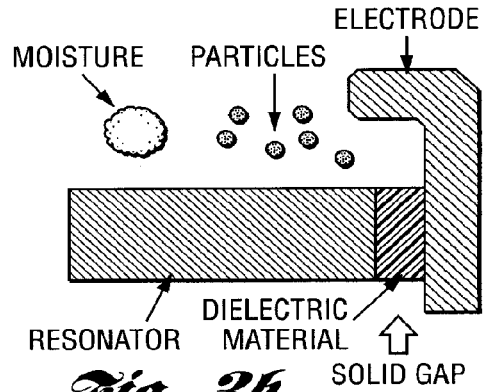
FIG. 3b is a side sectional schematic view of a solid gap between the micromechanical structures of FIG. 3a illustrating how a solid gap can better avoid issues with moisture, particles, and undesired etch by-products.

In addition to lower motional resistance, the use of solid dielectric-filled transducer gaps is expected to provide numerous other practical advantages over the air gap variety. In particular, the presence of a solid dielectric in the gap 1) better stabilizes the resonator structure against shock and microphonics; 2) eliminates the possibility of particles getting into an electrode-to-resonator air gap, which poses a potential reliability issue, as shown in FIG. 3b; 3) greatly improves fabrication yield, by eliminating the difficult sacrificial release step needed for air gap devices; and 4) potentially allows larger micromechanical circuits (e.g., bandpass filters comprised of interlinked resonators) by stabilizing constituent resonators as the circuits they comprise grow in complexity.

In essence, the above advantages translate to lower overall manufacturing cost, since fewer devices are lost during the manufacturing process. This perhaps is an even more important benefit than motional resistance reduction.

Solid-Gap Design Issue: Increased Overlap Capacitance

In tandem with the advantages outlined above, solid gap resonators introduce design considerations that were not present for previous air gap resonators. Perhaps the most important of these arises from the much higher permittivity and smaller gap spacing they provide, which drive the static electrode-to-disk capacitance $C_o$, shown in FIG. 2(b) and given by $$C_o = \frac{\varepsilon_r \varepsilon_o A_o}{d_o} = \frac{\varepsilon_r \varepsilon_o \pi R h}{d_o}, \quad (8)$$

to much higher values than previous air gap counterparts. In particular, when converting to a solid gap design, the electrode-to-resonator gap spacing decreases from 80 nm to 20 nm, and $\epsilon_r$ increases from 1 to 7.8, $C_o$ becomes 31.2× larger. At first, this seems to be a significant problem, since this larger $C_o$ would increase capacitive loading, making circuit design at high frequency more difficult. However, $R_x$ is a stronger function of $d_o$ and $\epsilon_r$ than $C_o$, so it shrinks faster than $C_o$ grows, actually making circuit and system design easier (in most cases) when using solid-gap resonators.

Fabrication

The micromechanical wine-glass disk resonators measured in this work were fabricated via processes based upon the self-aligned, small lateral gap, polysilicon wafer-level surface-micromachining process previously used to achieve GHz disk resonators in [3]. In this process, summarized by the views of FIGS. 4a-4d, lateral electrode-to-resonator air-gap spacings 10 are defined by the thickness of a conformally deposited sidewall oxide layer 12, which is later removed by an isotropic hydrofluoric acid (HF) wet etchant to achieve the desired electrode-to-resonator air gaps 10 (i.e., FIG. 4d).

In FIGS. 4a-4d, an N$^+$ layer (ground plane) 14 is formed on a silicon substrate 16. Isolation oxide 18 is formed on the layer 14. Isolation nitride 20 is formed on the oxide 18. A doped PolySi interconnection 22 is formed on the nitride 20. Sacrificial oxide 24 is formed on the PolySi 22. A doped PolySi disk structure 26 is formed on the PolySi 24. An oxide hard mask 28 is formed on the PolySi 26.

Figure 4A:
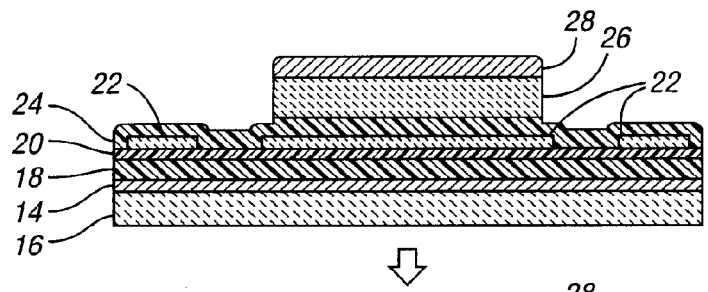
FIGS. 4a-4d provide a plurality of interrelated, cross-sectional views briefly describing the fabrication processes used for air-gap wine-glass disk resonators and FIGS. 4a and 4e-4g provide a plurality of interrelated, cross-sectional views briefly describing the fabrication processes for solid-gap wine-glass disk resonators.
Figure 4B:
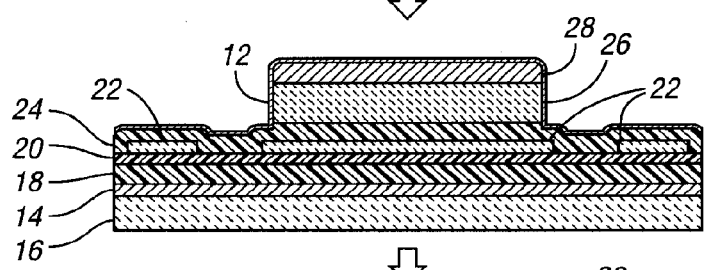

In FIG. 4b, 80-nm of LPCVD oxide gap 12 is formed on the mask 28, the PolySi 26 and the PolySi 24.

Figure 4C:
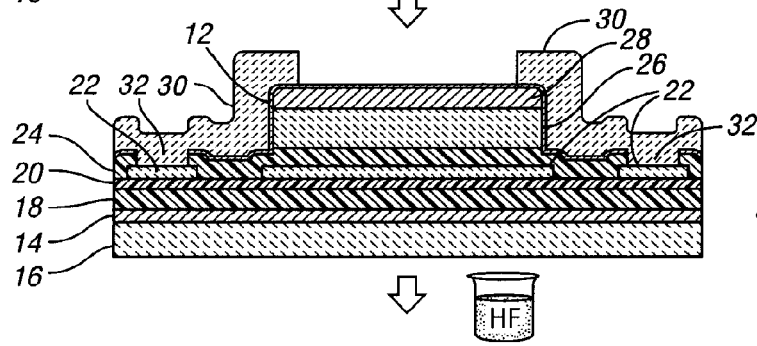
Figure 4D:
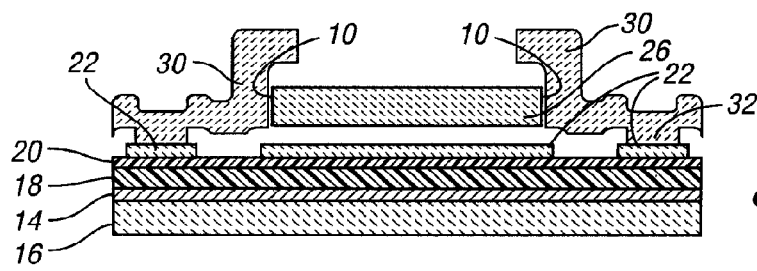

In FIG. 4c, doped PolySi electrodes 30 and anchors 32 are formed.

Figure 4E:
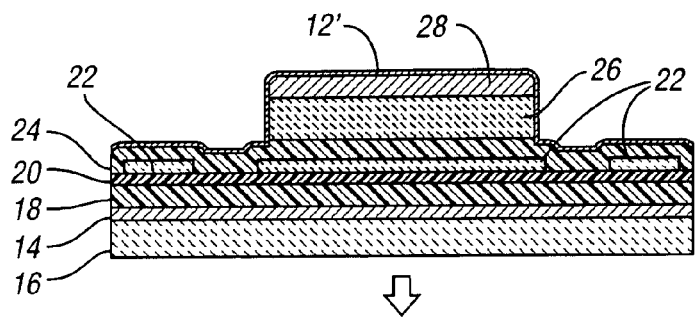
Figure 4F:
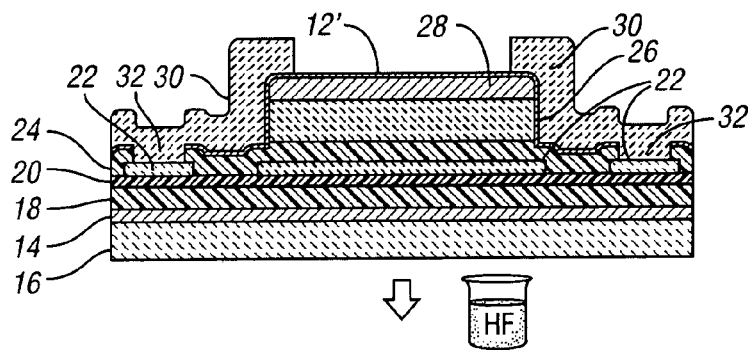
Figure 4G:
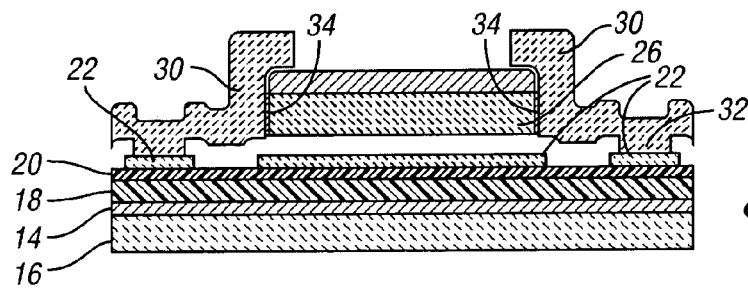

For solid-gap resonators of one embodiment of the present invention, the process is defined by the views of FIG. 4a and FIGS. 4e-4g. The views of FIGS. 4e-4g are substantially identical to the views of FIGS. 4b-4d, respectively, except silicon nitride 12', instead of silicon dioxide 12, is deposited via LPCVD to form a sidewall spacer 34. During the sacrificial hydrofluoric acid release step, the oxide underneath and above the disk-electrode structure is removed, as is any exposed nitride (due to the finite 10 nm/min etch rate of nitride in HF), but the nitride spacer 34 in the electrode-to-resonator gap remains intact, as shown in FIG. 4g, since it is effectively protected from HF attack by the slow diffusion of the wet etchant into the tiny, solid nitride-filled, electrode-to-resonator gap. Interestingly, the air-gap process actually proved to be the more difficult of the two, because it required removal of oxide in small gaps, which is a difficult, diffusion-limited process. As a consequence, the solid-gap designs were able to achieve smaller gaps of 20 nm, whereas the air gaps were limited to about 60 nm.

Figure 5A:
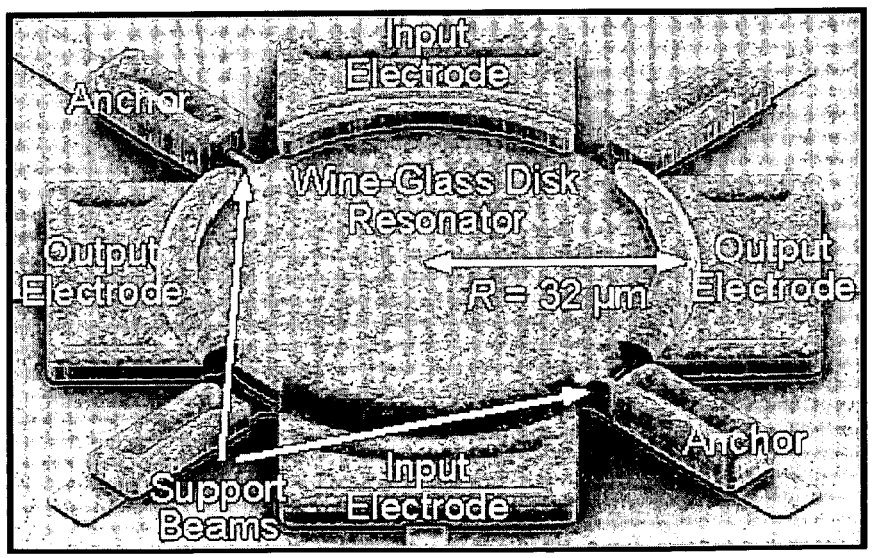

FIG. 5a presents the SEM of a fabricated 60-MHz micromechanical wine-glass disk resonator, together with two zoom-in views of its 20-nm solid nitride gap (i.e., FIGS. 5b and 5c). As shown, even after a 35 minute long hydrofluoric acid release etch, only a negligible amount of nitride at the top and bottom edges is removed, and most of the nitride is still left in the gap.

Experimental Results

Wine-glass disk resonators equipped with 80-nm air and 20-nm nitride gaps were tested inside a custom-built chamber capable of reaching vacuums down to 50 µTorr. The chamber had electrical feedthroughs that connected a pc board housing resonator dies to external measurement instrumentation, all interconnected as in the two-port setup of FIG. 1. Interestingly, the maximum usable dc-bias in this setup was not governed by the pull-in voltage of the air-gap disks, but rather by the breakdown voltage of their nitride-gap counterparts, which ended up being only 12 V for the 20-nm nitride gap devices used here. As expected, the breakdown voltage was a function of nitride filler quality, and varied from 4 V to 12 V, depending upon the quality of nitride sidewall deposition. The 12 V value is consistent with the 6-10 MV/cm dielectric breakdown electric field for nitride. It should be noted that 12 V is not that much smaller than the 15 V pull-in voltage typical for an 80-nm air-gap disk. Further, if a 20-nm air-gap could be achieved (i.e., could be cleared in a release step), then the pull-in voltage for the associated disk would likely be lower than the 12 V breakdown of a 20-nm nitride gap. In other words, a solid nitride gap likely allows a higher dc-bias voltage than an equivalent air gap.

Figure 6A:
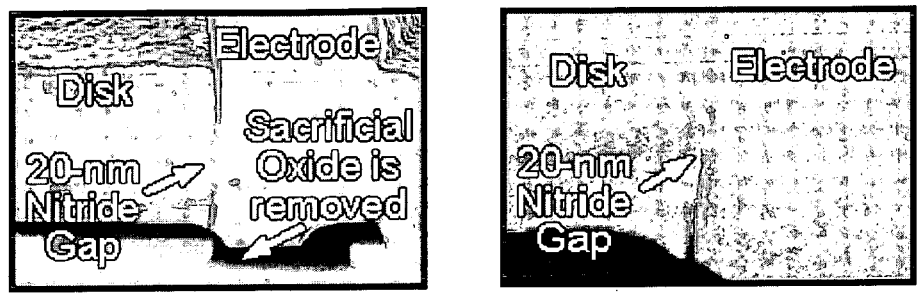
FIGS. 6a, 6b and 6c are graphs which show measured frequency characteristic for a fabricated 60 MHz wine-glass disk resonator with FIG. 6a showing a 80 nm air gap tested in vacuum.
Figure 6A:
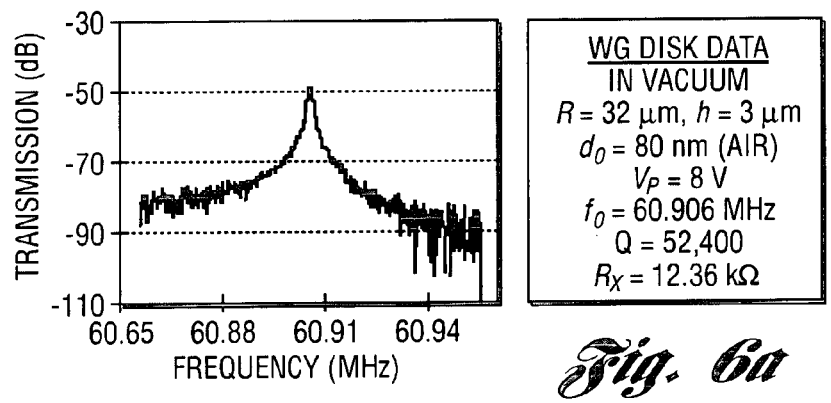
Figure 6B:
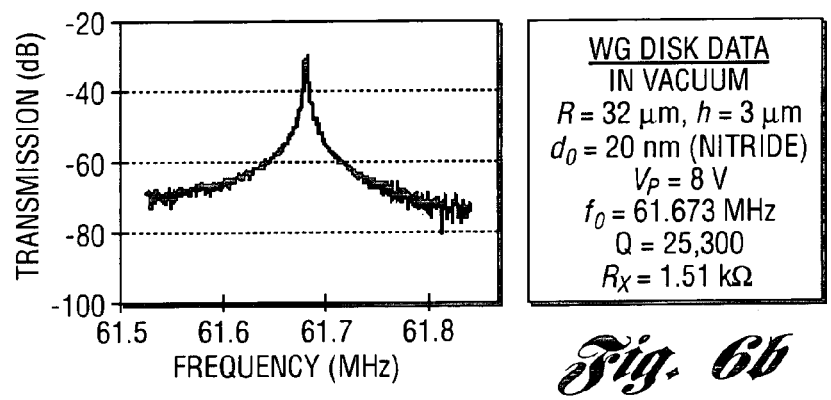

To stay clear of solid-dielectric breakdown, measurement dc-bias voltages for 60-MHz disks were constrained to only 8 V. FIG. 6(a) and FIG. 6(b) present measured frequency characteristics using the setup of FIG. 1 under 50 µTorr vacuum for 60-MHz wine-glass disk resonators with 80-nm air-gap and 20-nm nitride-gap capacitive transducers, respectively. As shown, compared with the 60.906 MHz and Q=52,400 of its air-gap counterpart, the nitride-gap wine-glass disk resonator not only retained a very similar resonance frequency of 61.673 MHz, only 1.26% different; but also exhibited a Q of 25,300, which is about half that of the air gap device, but still more than adequate for the most demanding communications applications; and all while achieving an 8.19× smaller $R_x$ down to only 1.51 kΩ. If a larger dc-bias bias voltage were permitted, perhaps by improving the quality of the gap-filling nitride dielectric material, even smaller values of $R_x$ should be achievable.

Figure 7A:
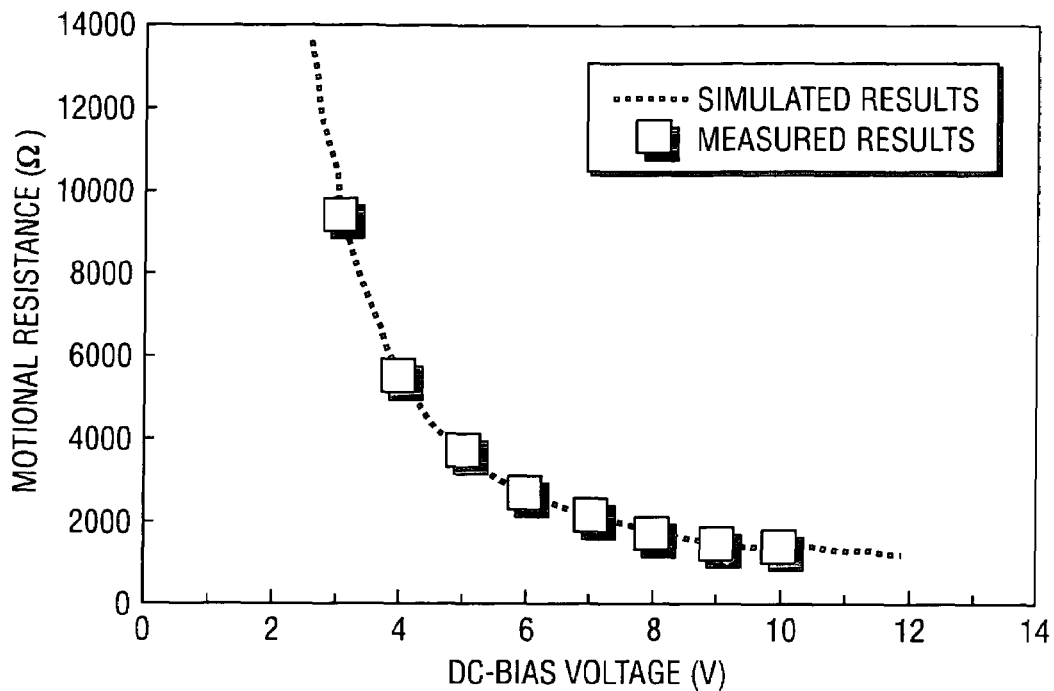
FIGS. 7a and 7b are graphs.
Figure 7B:
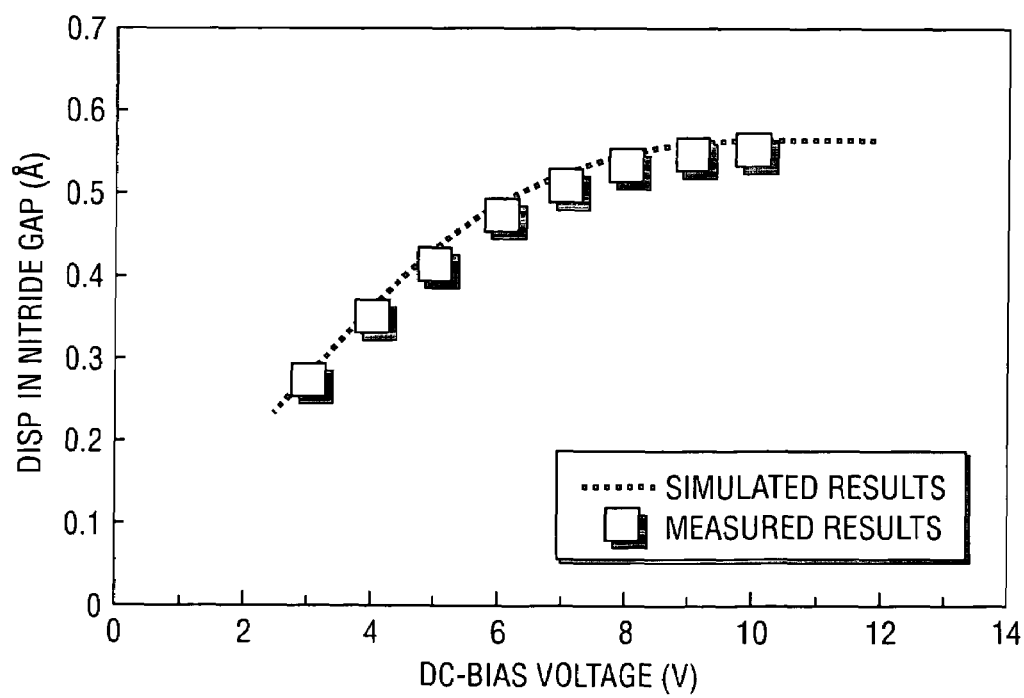

Interestingly, filling the electrode-to-resonator gap with a solid does not seem to impact the Q a great deal. It does, however, greatly reduce the plate-to-plate displacement in the capacitive transducer. In particular, the measured output motional current of 5.5 µA corresponds to a peak gap thickness displacement of only 0.53 Å for the solid-gap wine-glass disk, to be compared with the ~20 Å of its air-gap counterpart. To further explore the degree of reduction in edge-to-edge gap displacement, FIG. 7(a) and FIG. 7(b) present measured and simulated motional resistance and nitride displacement versus dc-bias voltage, respectively, for a 60-MHz wine-glass disk resonator with a 20-nm nitride electrode-to-resonator gap. As shown, the measured results match well with the predicted results from (6), where a stiffness quotient γ of $7.67 \times 10^{-4}$ is extracted from one of the data points. Despite the reduction in plate-to-plate displacement, the increase in dielectric permittivity and smaller 20-nm gap afforded via use of a solid nitride gap still insure a sizable net reduction in $R_x$.

Figure 6C:
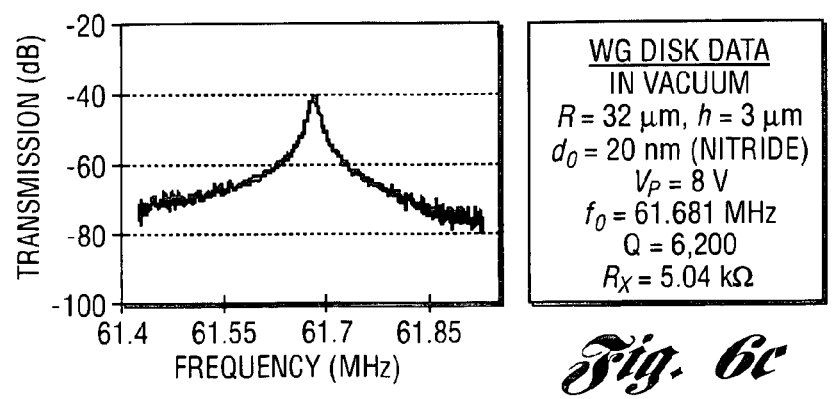

To compare vacuum versus air operation of solid-gap micromechanical disks, FIG. 6(c) presents measured frequency response spectra for the same 60-MHz nitride gap wine-glass disk resonator shown in FIG. 6(b), but in atmosphere rather than in vacuum. As shown, the measured Q of 6,200 in atmosphere, while still very good, is much smaller than the Q of 25,300 it posts in vacuum—a result that poses somewhat of a quandary, since a solid gap should not pump gas the way that an air-gap would, so should suffer much less Q degradation when switching from vacuum to air. The fact that Q does degrade significantly might indicate either (a) the electrodes are moving in unison with the disk itself, pushing air around, while the nitride gap compresses ever so slightly (i.e., only 0.53 Å); (b) the solid nitride gap is not solidly attached to either the disk or electrode, allowing a very small amount of movement across a tiny 0.53 Å air gap, which pumps air, thereby lowering Q; or (c) the nitride material in the gap is porous, with air bubbles, that get pumped as the gap compresses and expands.

Figure 8A:
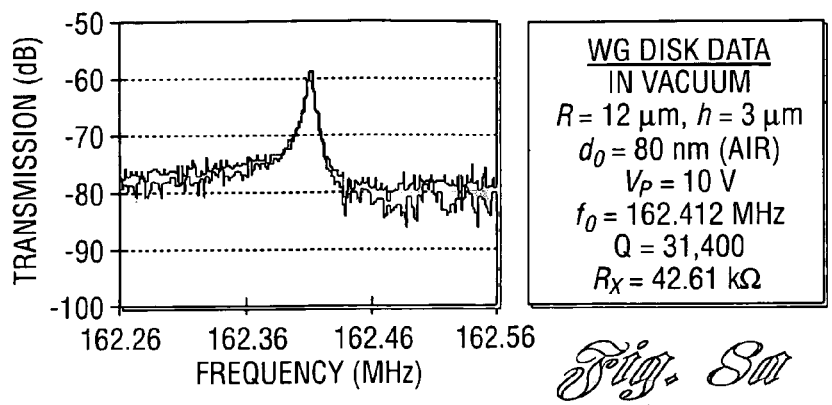
FIGS. 8a and 8b are graphs which show measured frequency characteristic for a fabricated 160 MHz wine-glass disk resonator.
Figure 8B:
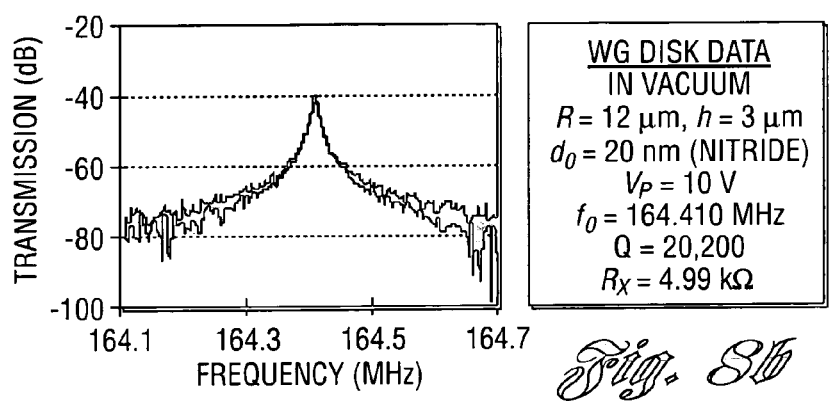

In the meantime, measurements were taken to verify the efficacy of solid-gap design at even higher frequencies. FIG. 8(a) and FIG. 8(b) present measured frequency characteristics under 50 µTorr vacuum for 160-MHz wine-glass disk resonators with 80-nm air and 20-nm nitride gaps, respectively. Again, the nitride gap resonator has a similar resonance frequency, a slightly smaller but still impressive Q of 20,200, and an 8.54× smaller $R_x$, compared to its air gap counterpart.

Towards Even Lower Impedance

Figure 9:
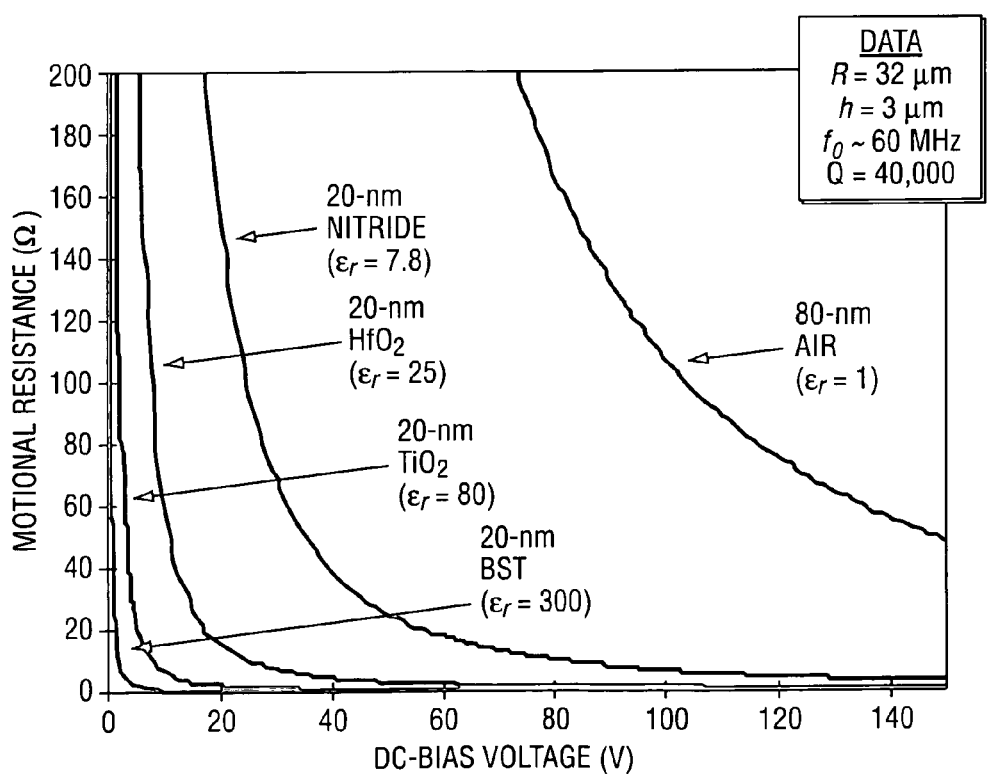
FIG. 9 shows graphs illustrating predicted values of motional resistance versus dc-bias voltage for different dielectric materials as well as air.

The 8× reduction in series motional resistance demonstrated using solid-nitride capacitive transducer gaps in this work, although already impressive, is only an inkling of what should be possible. Indeed, there are many other thin-film dielectrics with much higher dielectric constants than silicon nitride, including hafnium dioxide ($HfO_2$, $\epsilon_r=25$), titanium dioxide ($TiO_2$, $\epsilon_r=80$), or barium strontium titanate (BST, $Ba_xSr_{1-x}TiO_3$, $\epsilon_r \sim 300$). With an inverse square law dependence of $R_x$ on permittivity, there seems to be plenty of room for further impedance improvement. FIG. 9 plots predicted values of series motional resistance $R_x$ versus dc-bias voltage $V_P$, showing that impedances on the order of 50Ω might be achievable with IC-compatible dc-bias voltages of only 0.91 V.

CONCLUSIONS

MEMS-based vibrating micromechanical resonators equipped with solid dielectric lateral capacitive transducer gaps have been demonstrated for the first time. Compared to otherwise identical air gap versions, solid gap resonators have similar resonant frequencies, slightly smaller, but still very impressive high Q's, and much smaller motional resistance. Viewed from the perspective of dc-bias voltage, the same impedance can be achieved in a solid gap resonator as an air gap counterpart, but using a much smaller dc-bias voltage—a very important feature that should greatly simplify future integration of MEMS resonators with integrated circuit transistors.

In addition to lower motional resistance, the use of filled-dielectric transducer gaps provides numerous other benefits over the air gap variety, since it (a) better stabilizes the resonator structure against shock and microphonics; (b) eliminates the possibility of particles getting into an electrode-to-resonator air gap, which poses a potential reliability issue; (c) greatly improves fabrication yield, by eliminating the difficult sacrificial release step needed for air gap devices; and (d) potentially allows larger micromechanical circuits (e.g., bandpass filters comprised of interlinked resonators) by stabilizing constituent resonators as the circuits they comprise grow in complexity.

While embodiments of the invention have been illustrated and described, it is not intended that these embodiments illustrate and describe all possible forms of the invention. Rather, the words used in the specification are words of description rather than limitation, and it is understood that various changes may be made without departing from the spirit and scope of the invention. For example, while a lateral mode of operation of the micromechanical structures is shown, vertical mode of operation is possible as well, as well as a vertical-to-lateral mode of operation.

What is claimed is:

1. A micromechanical device comprising:
   a capacitively-transduced micromechanical resonator operable in a mode of operation, the resonator being fabricated on a substrate and having a motional resistance;
   a micromechanical electrode, the resonator and the electrode defining a capacitive transducer gap which expands and contracts during the mode of operation; and
   a dielectric having a permittivity value that is higher than the permittivity value of air disposed in the gap to decrease the motional resistance of the resonator.

2. The device of claim 1 wherein the dielectric is a fluid.

3. The device of claim 1 wherein the dielectric is selected from a group comprising titanium dioxide, hafnium dioxide, silicon nitride, and barium strontium titanate.

4. The device of claim 1 wherein the dielectric is a porous solid material.

5. The device of claim 1 wherein the resonator is operable in a wine-glass mode.

6. The device of claim 1 wherein the dielectric is dimensioned so that its electrode-to-resonator thickness corresponds to an effective quarter-wavelength of the resonance frequency of the resulting electrode-dielectric-resonator structure.

7. The device as claimed in claim 1, wherein the gap is a lateral gap.

8. The device as claimed in claim 1, wherein the resonator is a lateral resonator.

9. The device as claimed in claim 8, wherein the lateral resonator is a disk resonator.

10. The device as claimed in claim 1, wherein spacing of the gap is less than 60 mm.

11. The device as claimed in claim 1, wherein the resonator is configured to connect to a DC bias voltage source.

12. The device as claimed in claim 1, wherein the electrode is configured to connect to an AC signal voltage source.

13. The device as claimed in claim 1, wherein the dielectric is barium strontium titanate.

14. A method of forming an electrostatic transducer, the method comprising:
    forming a micromechanical electrode structure;
    forming a capacitively-transduced micromechanical resonator structure having a mode of operation, the resonator structure being formed on a substrate, wherein the electrode structure is separated from the resonator structure by a capacitive transducer gap which expands and contracts during the mode of operation; and
    filling the gap with a dielectric having a permittivity value that is higher than the permittivity value of air.

15. The method of claim 14 wherein the dielectric is selected from a group comprising titanium dioxide, hafnium dioxide, silicon nitride, and barium strontium titanate.

16. The method of claim 14 wherein the resonator structure is operable in a wine-glass mode.

17. The method of claim 14 wherein the dielectric is a fluid.

18. The method of claim 14 wherein the dielectric is a porous solid material.

19. The method of claim 14 wherein the dielectric is dimensioned so that its dielectric-to-resonator thickness corresponds to an effective quarter-wavelength of the resonance frequency of the resulting electrode-dielectric-resonator structure.

* * * * *